US010726898B1

(12) United States Patent
Maffitt et al.

(10) Patent No.: US 10,726,898 B1
(45) Date of Patent: Jul. 28, 2020

(54) MRAM SENSE AMPLIFIER WITH SECOND STAGE OFFSET CANCELLATION

(71) Applicant: International Business Machines Corporation, Armonk, NY (US)

(72) Inventors: Thomas Martin Maffitt, Butlington, VT (US); John Kenneth Debrose, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/447,544

(22) Filed: Jun. 20, 2019

(51) Int. Cl.
*G11C 11/16* (2006.01)
(52) U.S. Cl.
CPC .................. *G11C 11/1673* (2013.01)
(58) Field of Classification Search
CPC .................................................. G11C 11/1673
USPC .......................................................... 365/158
See application file for complete search history.

(56) References Cited

U.S. PATENT DOCUMENTS

| 5,332,931 | A | 7/1994 | Crispie et al. |
| 6,191,989 | B1 * | 2/2001 | Luk ........................ G11C 7/062 365/207 |
| 7,254,077 | B2 | 8/2007 | Hung et al. |
| 9,070,466 | B2 * | 6/2015 | Jefremow ........... G11C 11/1673 |
| 9,384,792 | B2 | 7/2016 | Bonaccio et al. |
| 9,613,674 | B2 | 4/2017 | DeBrosse |
| 9,792,962 | B1 | 10/2017 | La Rosa et al. |
| 2007/0024325 | A1 | 2/2007 | Chen |

FOREIGN PATENT DOCUMENTS

KR      101704929 B1 *  2/2017

* cited by examiner

*Primary Examiner* — Fernando Hidalgo
(74) *Attorney, Agent, or Firm* — Patterson + Sheridan, LLP

(57) ABSTRACT

A sense amplifier circuit for sensing a data state of a data cell during a read cycle is described. The circuit includes a first stage with first circuitry to output a reference voltage and a data voltage relating to the data state of the data cell. The circuit further includes a second stage with circuitry to amplify a difference between the reference voltage and the data voltage. This circuitry includes a plurality of inverters and a plurality of capacitors. The read cycle includes a compensation phase. During the compensation phase the circuitry stores, at the capacitors, a voltage difference caused by a device mismatch of the inverters. After the compensation phase the circuitry amplifies the difference between the reference voltage and the data voltage, and compensates for the device mismatch using the stored voltage difference at the capacitors.

20 Claims, 10 Drawing Sheets

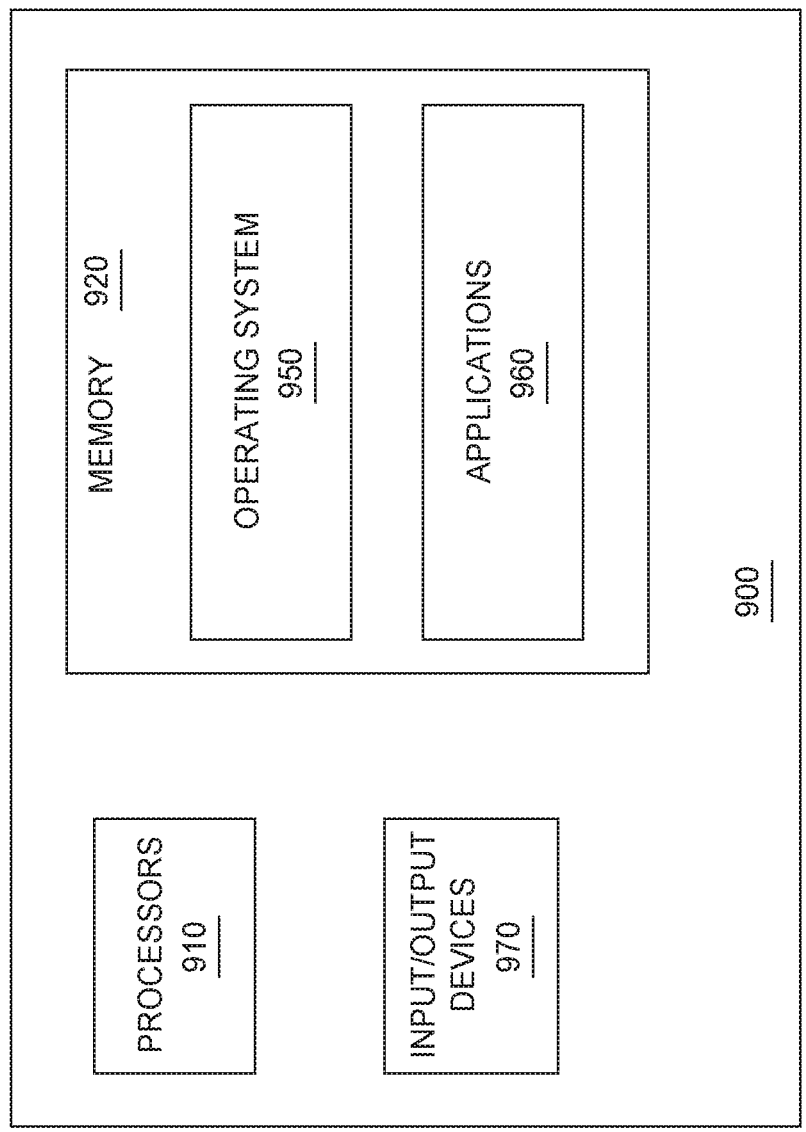

MRAM SENSE AMPLIFIER WITH SECOND STAGE OFFSET CANCELLATION

BACKGROUND

The present disclosure relates to electronic memory technology, and more specifically, though not exclusively, to a sense amplifier for magnetoresistive random access memory (MRAM), with offset cancellation in a second stage.

MRAM is an emerging memory technology, offering non-volatility, high performance, and high endurance. In one example, an MRAM cell includes two magnetic elements separated by a thin insulating layer. The polarity of one of the magnets is fixed, while the other can be changed. When the magnets are parallel the memory element has a lower resistance then the anti-parallel case. This difference in resistance can be read as memory bit in either a "0" or "1" state. The difference in resistance between states can vary depending on implementation and other factors, but may be equal to 2, i.e., a 100 percent change in resistance between the parallel and anti-parallel states.

In one form, MRAM uses spin-transfer torque (STT) techniques. A typical STT MRAM memory cell includes a magnetic tunnel junction in series with a field effect transistor (FET), which is gated by a word line. A bit line and a source line run parallel to each other and perpendicular to the word line. The bit line is connected to the magnetic tunnel junction, and the source line is connected to the FET. One memory cell along the bit line is selected by turning on its word line. When a relatively large voltage (e.g., 500 mV) is forced across the cell from bit line to source line, the selected cell's magnetic tunnel junction is written into a particular state, which is determined by the polarity of this voltage (bit line high vs. source line high).

When the cell is in a logic zero (0) or parallel state, its magnetic tunnel junction resistance is lower than when the cell is in a logic one (1) or anti-parallel state. Typical magnetic tunnel junction resistance values could include $R0=5\ K\Omega$ and $R1=10\ K\Omega$. A selected cell is read by sensing the resistance from bit line to source line. The "sense" or "read" voltage is much lower than the write voltage in order to clearly distinguish write and read operations, and to avoid inadvertently disturbing the cell during a read operation. Thus, sensing methodologies are capable of accurately sensing very low read voltage (e.g., less than 50 mV). The combination of a small difference in resistance and sensing the difference at a low voltage makes the design of a MRAM read system very challenging.

SUMMARY

Embodiments described herein include a sense amplifier circuit for sensing a data state of a data cell during a read cycle. The circuit includes a first stage, including first circuitry configured to output a reference voltage and a data voltage relating to the data state of the data cell. The circuit further includes a second stage, including second circuitry configured to amplify a difference between the reference voltage and the data voltage. The second circuitry includes a plurality of inverters and a plurality of capacitors. The read cycle includes a compensation phase. During the compensation phase the second circuitry is configured to store, at the capacitors, a voltage difference caused by a device mismatch of the inverters. After the compensation phase the second circuitry is configured to amplify the difference between the reference voltage and the data voltage, and to compensate for the device mismatch using the stored voltage difference at the capacitors.

Embodiments described herein further include a magnetoresistive random access memory (MRAM) system. The system includes a plurality of MRAM data cells. The system further includes a sense amplifier circuit for sensing a data state of a data cell of the plurality of MRAM data cells during a read cycle. The sense amplifier circuit includes a first stage, including first circuitry configured to output a reference voltage and a data voltage relating to the data state of the data cell. The sense amplifier circuit further includes a second stage, including second circuitry configured to amplify a difference between the reference voltage and the data voltage. The second circuitry includes a plurality of inverters and a plurality of capacitors. The read cycle includes a compensation phase. During the compensation phase the second circuitry is configured to store, at the capacitors, a voltage difference caused by a device mismatch of the inverters. After the compensation phase the second circuitry is configured to amplify the difference between the reference voltage and the data voltage, and to compensate for the device mismatch using the stored voltage difference at the capacitors.

Embodiments described herein further include a method of reading data from an MRAM system. The method includes generating a reference voltage and a data voltage relating to a data state of a data cell in the MRAM system by performing a read of the data cell during a read cycle, using a first stage of a sense amplifier circuit. The method further includes amplifying a difference between the reference voltage and the data voltage, during the read cycle, using a second stage of the sense amplifier circuit. The second stage includes a plurality of inverters and a plurality of capacitors. The read cycle includes a compensation phase. During the compensation phase the second stage is configured to store, at the capacitors, a voltage difference caused by a device mismatch of the inverters. After the compensation phase the second stage is configured to amplify the difference between the reference voltage and the data voltage, and to compensate for the device mismatch using the stored voltage difference at the capacitors.

BRIEF DESCRIPTION OF THE SEVERAL VIEWS OF THE DRAWINGS

FIG. 9 illustrates an example computer, according to one embodiment described herein.

DETAILED DESCRIPTION

As noted above, designing a magnetoresistive random access memory (MRAM) read system can be very challenging. In particular, designing a sense amplifier suitable to detect the relatively small difference in resistance at a low voltage can be challenging. For example, FET mismatch between transistors in the sense amplifier can be significant enough to affect read accuracy. In a two-stage sense amplifier, in which a voltage difference generated in a first stage is amplified and identified using a second stage (e.g., a comparator), FET mismatch between devices in the second stage can create errors and affect the robustness of the read system. One or more techniques disclosed herein relate to a two stage sense amplifier for an MRAM system, in which the second stage includes a circuit that self-cancels any FET device mismatch, consequently improving the robustness of the read system. While the illustrated embodiments focus on MRAM, one or more of the techniques disclosed herein are also suitable for other memory systems, particularly systems involving low differential resistance or low read voltage.

Figure 1:
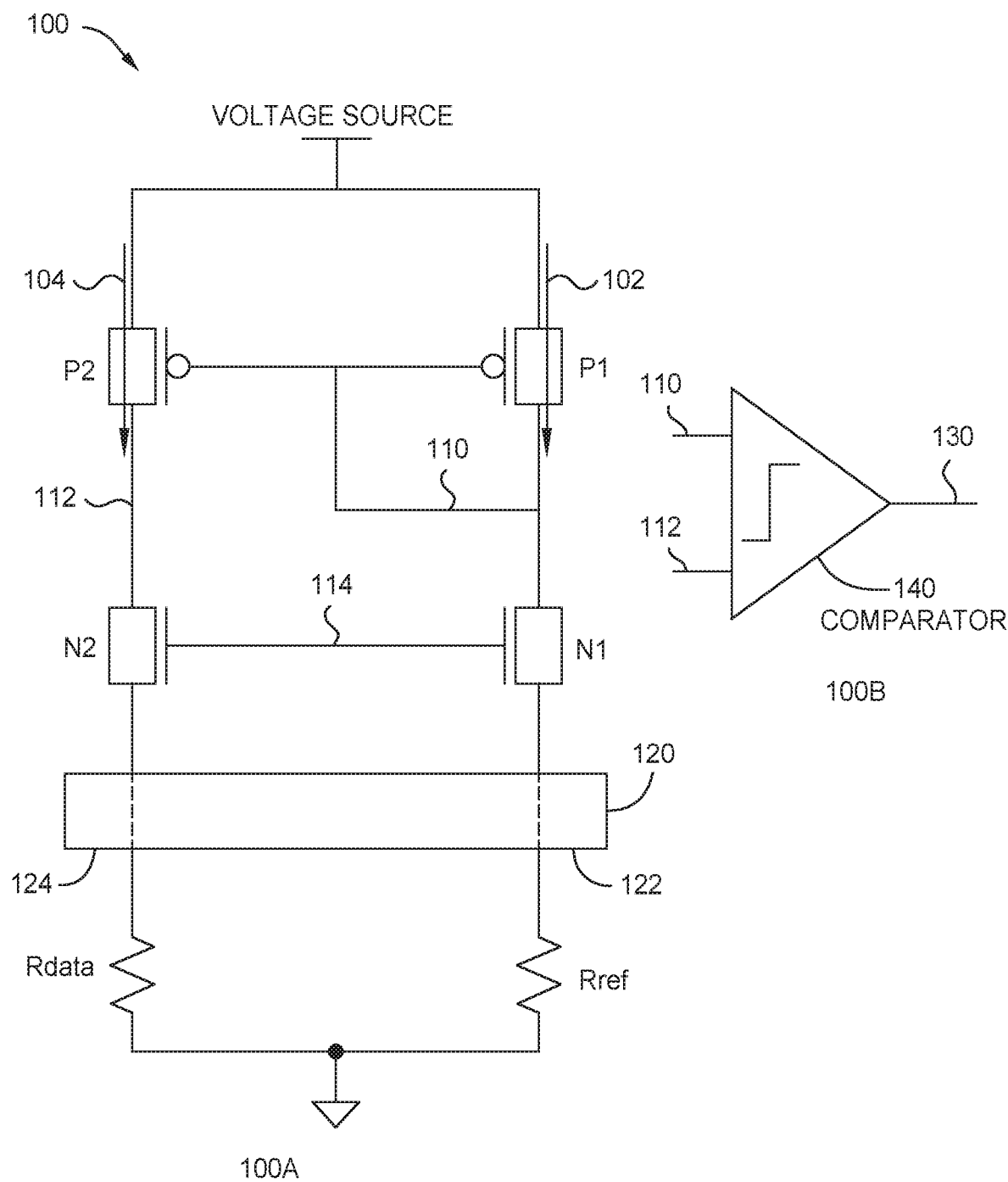
FIG. 1 illustrates an MRAM sense amplifier, according to one embodiment described herein.

FIG. 1 illustrates an MRAM sense amplifier 100, according to one embodiment described herein. The sense amplifier 100 is part of the read circuit of an MRAM system and is used when reading data from an MRAM cell. Reference and data currents are created by reference and data cells, respectively, at a fixed voltage. The change in current between the data and reference cells creates a voltage difference which corresponds to either a "0" or "1" data state. In an embodiment, the MRAM sense amplifier 100 includes a first stage 100A, which creates the voltage difference, and a second stage 100B, which amplifies and identifies the voltage difference (e.g., acting as comparator).

The first stage 100A of the sense amplifier 100 includes a column decoder/multiplexer 120 and bit lines 122 and 124. The bit line 122 is a reference bit line while the bit line 124 is a data bit line. The resistor Rref is used for the reference bit line while the resistor Rdata is used for the data bit line. A pair of n-channel transistors N1 and N2 form a source-follower circuit that clamps the bit lines (or source lines depending on the preferred read polarity) to the target read voltage at the clamp 114. The difference between the data cell current 104 and the reference cell current 102 is converted to a voltage difference by a p-channel (positive channel FET) current mirror load circuit made up of p-channel transistors P1 and P2.

Thus, the first stage 100A of the MRAM sense amplifier 100 generates a voltage difference between 110 and 112. The MRAM sense amplifier 100 further includes a second stage 100B, in which a comparator 140 is used to amplify and identify this voltage difference. In the second stage 100B, the voltage difference between 110 and 112 is sensed by a comparator 140 to produce the digital sense amplifier output 130 (e.g., a "0" or "1" conveying the value stored by the MRAM cell).

FIG. 1 illustrates a 2-legged sense amplifier, with one data leg and one reference leg in the first stage 100A. Alternatively, the sense amplifier may be 3-legged, with one data leg and two reference legs. In this alternative, the values of the two reference legs are averaged and compared with the data leg.

The techniques illustrated in FIG. 1, however, are sensitive to FET mismatch between the p-channel transistors P1 and P2 and between the n-channel transistors N1 and N2.

For example, in FIG. 1, a current 102 is sourced from the p-channel transistor P1 while a current 104 is sourced from the p-channel transistor P2. In an embodiment, FET mismatch between P1 and P2 can lead to variance between currents 102 and 104. FET mismatch is a common phenomenon influencing the performance of analog circuits. Despite the use of layout techniques to minimize mismatch, any two seemingly identical FETs will have slightly different values of threshold voltage and transconductance due to local variations in device dimensions, gate oxide thickness, channel doping, and other physical parameters. These mismatches result in finite random offsets in circuits which would otherwise have zero offset. Furthermore, as FET device technology scales, the sensitivity to FET mismatch can increase.

In the case of an MRAM sense amplifier (e.g., the sense amplifier 100), FET mismatch results in a degradation of read margin. The threshold data cell resistance (the data cell resistance at which the sense amplifier switches from an output of 0 to an output of 1) is moved from its ideal value. For example, the output 130 is proportional to the difference between the reference and data current, but with two error terms from the P1/P2 and N1/N2 pair mismatch errors. This error can be significant, causing sense amplifier to sense amplifier variations and as a consequence a variation in the signal margin and ultimately read robustness.

Figure 2:
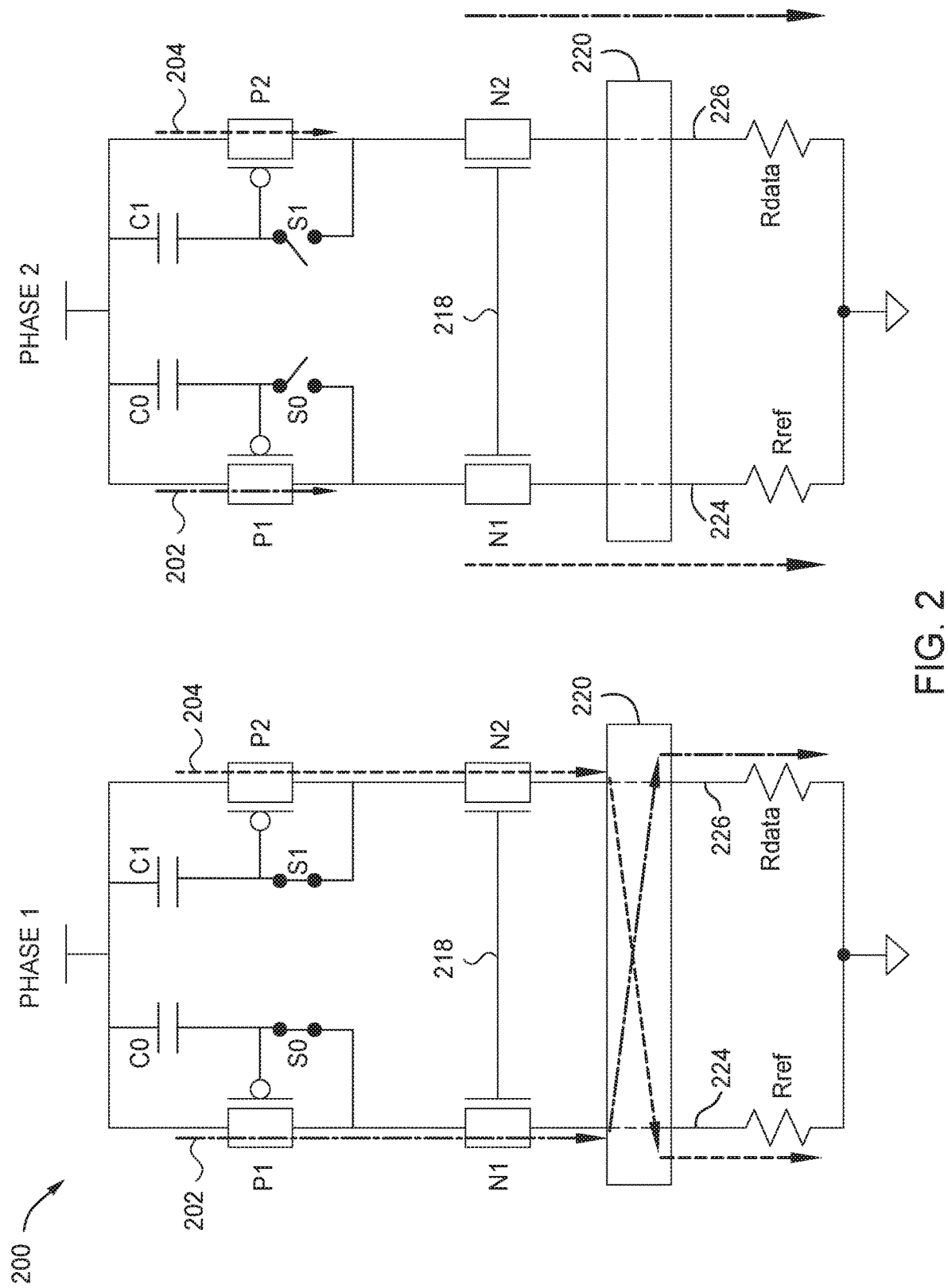
FIG. 2 illustrates a further MRAM sense amplifier, according to one embodiment described herein.

FIG. 2 illustrates an MRAM sense amplifier 200, according to one embodiment described herein. In an embodiment, FIG. 2 addresses FET mismatch by introducing a 2 phase, "sample and hold" technique, as illustrated. In this solution, the data and reference loads are switched between the left and right legs of the sense amplifier 200 between phase 1 and 2, as the diode connections S0 and S1 coupled to the p-channel devices P1 and P2 are opened. The gate voltage of the p-channel device during phase 1 is stored on the capacitors C0 and C1. As a result, during phase 2 the load devices P1 and P2 become current sources based on the phase 1 load. That is, during phase 1 the capacitors C0 and C1 store the gate voltages of P1 and P2, respectively. During phase 2, the switches S0 and S1 open, and the p-channel transistors P1 and P2 become current sources.

Further, during phase 1 the p-channel transistor P1 sources the data current 202 while the p-channel transistor P2 sources the reference current 204. During phase 1 the column decoder/multiplexer 220 is configured to swap legs, so that the output from the n-channel transistor N1 is coupled to Rdata while the output from the n-channel transistor N2 is coupled to Rref. As above in FIG. 1, the n-channel transistors N1 and N2 form a circuit that clamps the bit lines to the target read voltage at the clamp 218. The sense amplifier 200 includes a column decoder/multiplexer 220 and bit lines 224 and 226. The bit line 224 is a reference bit line while the bit line 226 is a data bit line.

This means that during phase 1, the reference current 204 flows through the right leg of the sense amplifier before reaching the column decoder/multiplexer 220, and the reference current is then swapped to flow through the resistor Rref. Further during phase 1 the data current 202 flows through the left leg of the sense amplifier before reaching the column decoder/multiplexer 220, and the reference current is then swapped to flow through the resistor Rdata. During phase 2, the column decoder/multiplexer 220 stops swapping legs, so that the data current 202 flows through the resistor Rref while the reference current 204 flows through the resistor Rdata.

Since the loads switch from phase 1 to 2, the source current, including the device pair mismatch current offsets of the left and right legs of the sense amplifier, are sourced to both the data and reference loads. This leads to a two times increase in signal and a cancelation of the device mismatch errors, compared to the techniques illustrated in FIG. 1.

Figure 3:
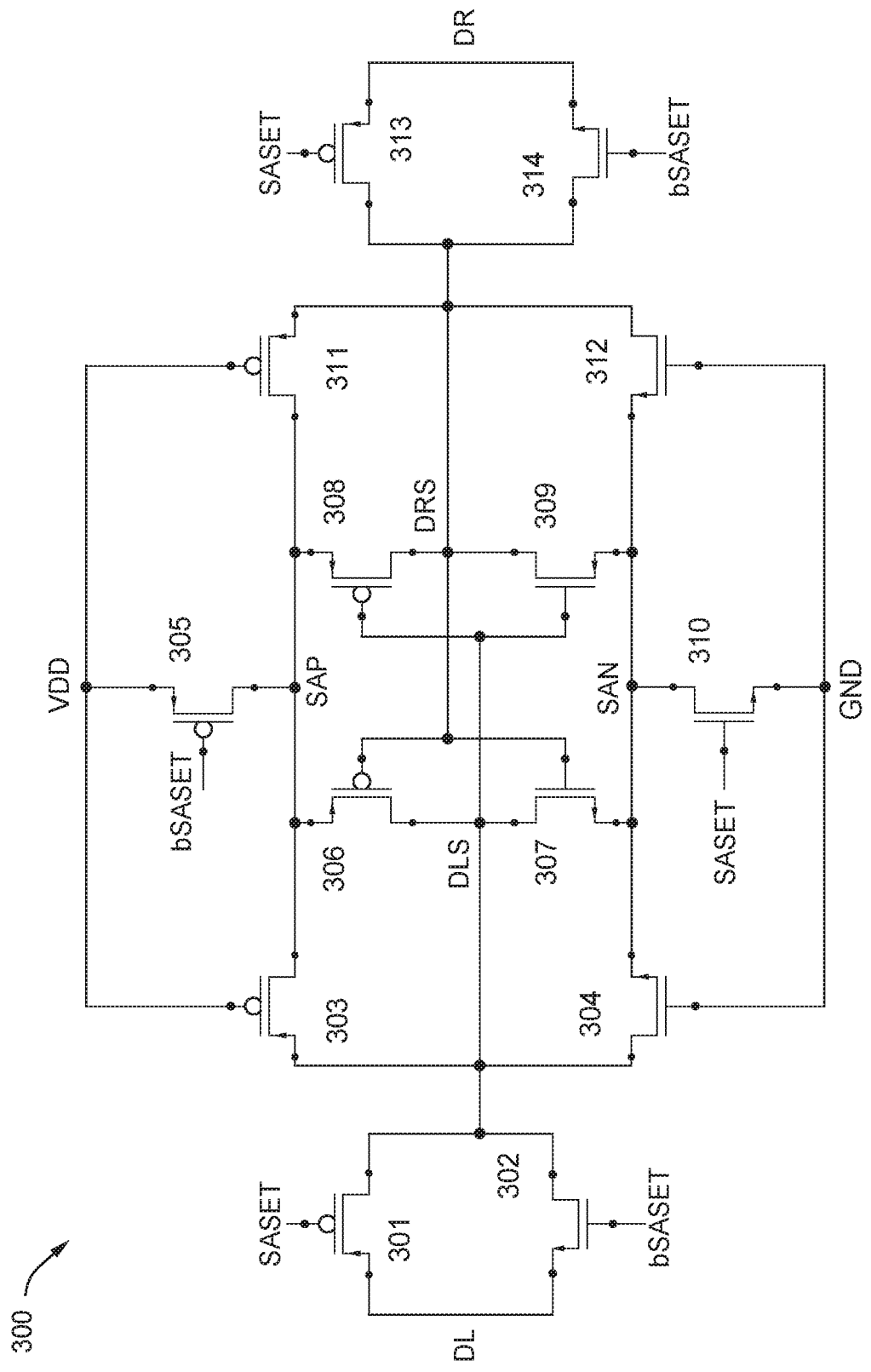
FIG. 3 illustrates a second stage in an MRAM sense amplifier, according to one embodiment described herein.

FIG. 3 illustrates a second stage in an MRAM sense amplifier, according to one embodiment described herein. As discussed above, an MRAM sense amplifier can include two stages. A first stage in which a voltage difference is identified (e.g., the difference between 110 and 112 illustrated in FIG. 1). And a second stage in which a comparator (e.g., comparator 140 illustrated in FIG. 1) is used to amplify the voltage difference and produce the digital sense amplifier output (e.g., the output 130 illustrated in FIG. 1). FIG. 3 illustrates a second stage sense amplifier (e.g., a comparator) 300 used to amplify and latch the output of the read cell.

For example, as illustrated in FIG. 3, assume one input to the comparator, DL (e.g., 112 illustrated in FIG. 1), is 20 mv greater than the other input, DR (e.g., 110 illustrated in FIG. 1). The voltage on the gates of PFET device 308 and NFET device 309 is 20 mv greater than the voltage on the gates of PFET device 306 and NFET device 307. When SASET is high (e.g., the read stage is active) and bSASET low (e.g., the inverse of SASET), with matched devices, the on current of the NFET device 309 is greater than the NFET device 307 and the on current of the PFET device 306 is greater than the PFET device 308. Assuming the FET devices are sufficiently matched, this will cause the latch combination of devices 306, 307, 308, and 309 to pull DLS to VDD and DRS to ground and the comparator 300 will output the correct digital value.

But FET mismatch between the PFET device pair 306 and 308, or between the NFET device pair 307 and 309, can contribute significant error to the comparator. For example, as above assume that the difference between the comparator inputs DR (e.g., 110 illustrated in FIG. 1) and DL (e.g., 112 illustrated in FIG. 1) is 20 mv. If the threshold voltage (VT) of the NFET device 309 is 20 mv greater than the VT of the NFET device 307, and the VT of the PFET device 306 is 20 mv greater than the VT of the PFET device 308, the latch will set incorrectly with DRS at VDD and DLS at ground. This would cause the read system to output an incorrect state for the data bit being read.

Figure 4:
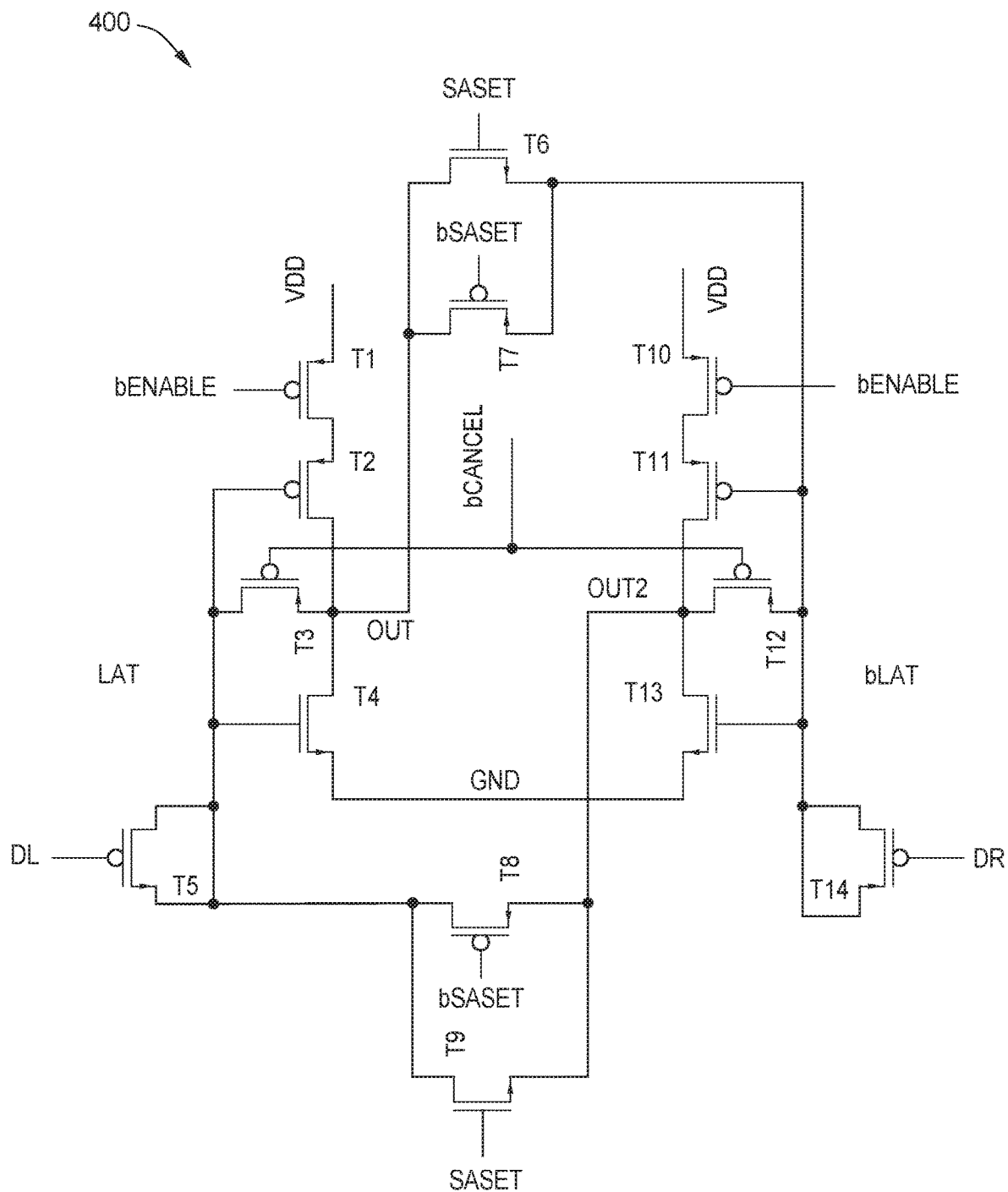
FIG. 4 further illustrates a second stage in an MRAM sense amplifier, according to one embodiment described herein.

FIG. 4 further illustrates a second stage in an MRAM sense amplifier, according to one embodiment described herein. In an embodiment, FIG. 4 illustrates a circuit 400 that self-cancels the device mismatches of other amplification/latch devices (e.g., the comparator 300 illustrated in FIG. 3), consequently improving the robustness of the read system. In the illustrated circuit 400 a latch is formed by devices T2, T4, T11, and T13. As in other comparator circuits (e.g., the comparator 300 illustrated in FIG. 3), FET mismatches between these four devices can reduce the robustness of the read system. In the circuit 400, however, these mismatches are cancelled. The operation of the circuit 400 is discussed further with regard to FIGS. 5-8, below.

Figure 5:
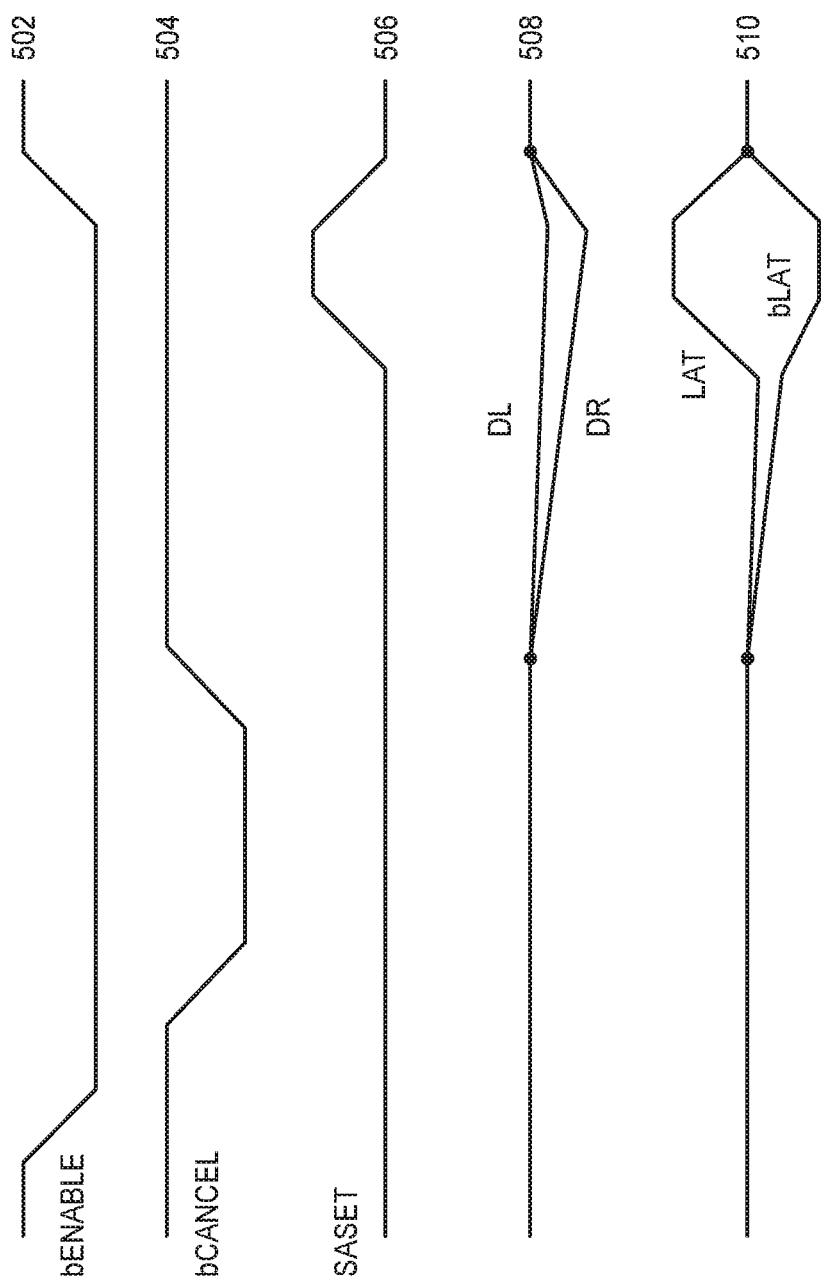
FIG. 5 is a timing diagram illustrating control signals in an MRAM sense amplifier, according to one embodiment described herein.

FIG. 5 is a timing diagram illustrating control signals in an MRAM sense amplifier, according to one embodiment described herein. The x-axis represents time, and the y-axis represents the values of the various signals over time. The timing diagram of FIG. 5 will be discussed together with the circuit 400 illustrated in FIG. 4.

The circuit 400 has four phases of operation: standby, mismatch compensation, signal amplification, and latch and hold. The timing sequence is as follows. First, bENABLE goes low at the beginning of read cycle, enabling the second stage of the sense amp. This is illustrated in graph 502 in FIG. 5.

Next, bCANCEL goes low during the first half the active cycle. This triggers the compensation phase and is illustrated in graph 504 in FIG. 5. In the circuit 400, bCANCEL going low shorts the output, OUT, of the left inverter formed by T2 and T4 to its input LAT. For the other inverter, T11 and T13, OUT2 is shorted to bLAT. This voltage will be the same for the left and right inverters if the left and right pairs of NFET (e.g., T4 and T13) and PFET (e.g., T2 and T11) devices are matched. The voltage will differ if the device pairs T4 and T13 or T2 and T11 are mismatched. This voltage is stored on the LAT and bLAT nodes by the capacitor formed by device T5 and T14, respectively. The difference in this voltage corresponds to the VT mismatch of the inverter pairs.

As illustrated in FIG. 4, two capacitors are formed by devices T5 and T14. While the illustrated embodiments use, as one example, PFET devices to form the capacitors, any suitable capacitor can be used. For example, NFET devices could be used, or any other suitable capacitor (e.g., not using FET devices at all) could be used.

Next, bCANCEL returns to high. The FET devices T2, T11, T4, and T13 once again act as inverters. As the signal develops in the second half of the read cycle (e.g., the right half of the timing diagram in FIG. 5) a difference in voltage develops between DL and DR. This difference in voltage is illustrated in graph 508 in FIG. 5. This voltage difference is coupled to LAT and bLAT.

Next, SASET goes high (e.g., as illustrated in the graph 506 in FIG. 5). The inverse signal bSASET (e.g., the inverse of SASET) goes low, connecting LAT to OUT2 and bLAT to OUT in the circuit 400. The inverters formed by the FET devices T2, T11, T4, and T13 are now connected as a cross coupled latch, and amplification begins.

Since the starting voltage of LAT and bLAT (e.g., as illustrated in graph 510) reflects any mismatches between the latch device pairs, the signal (DL-DR) is amplified without any loss from the mismatches. LAT and bLAT go to either VDD or GND and are latched and held as long as SASET is high (bSASET low) and bENABLE is low. In this way, any FET mismatches between the device pairs T2/T11 and T4/T13 are cancelled, and the robustness of the read cycle is improved.

Figure 6A:
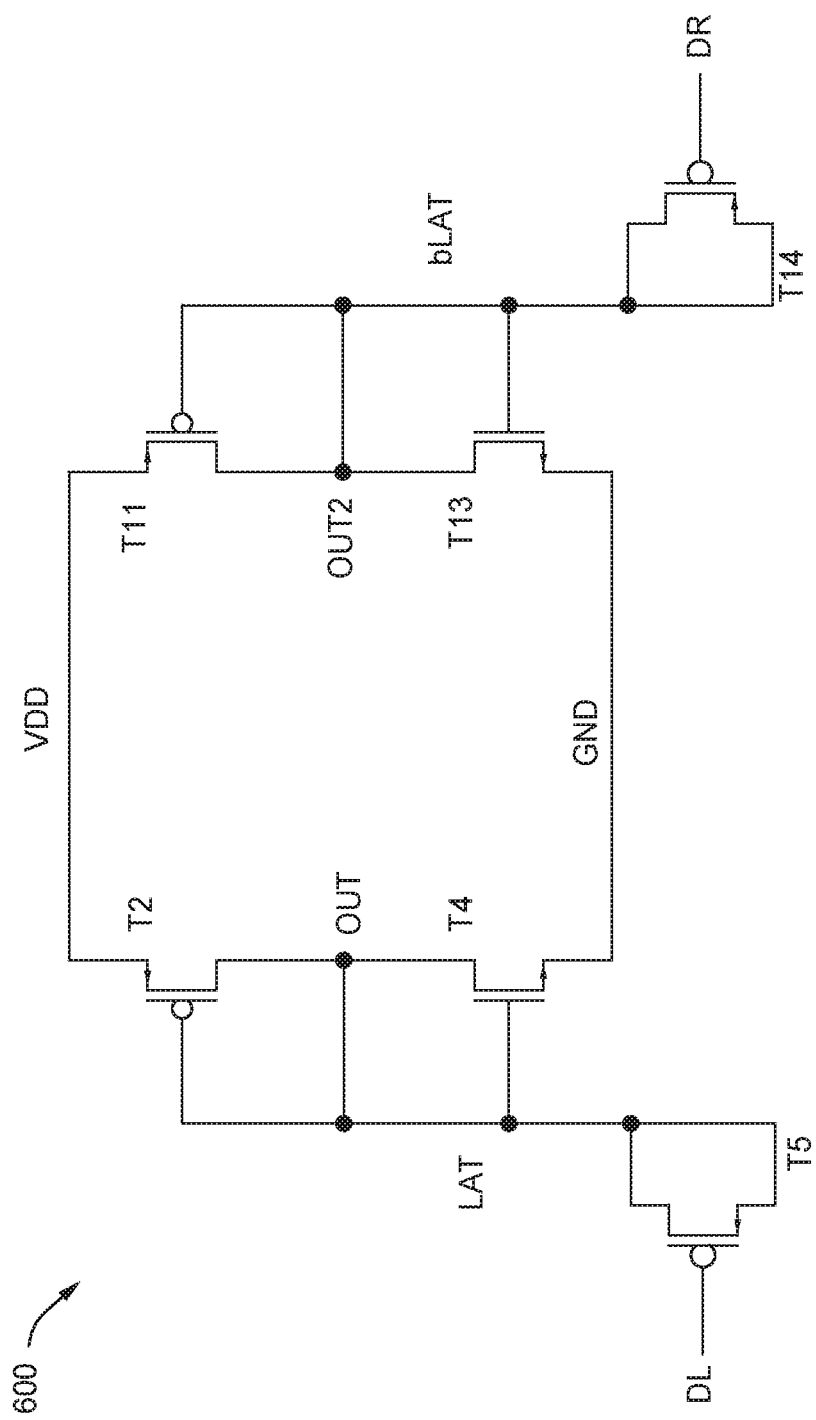
FIGS. 6A-B further illustrate a simplified representation of a second stage in an MRAM sense amplifier, according to one embodiment described herein.
Figure 6B:
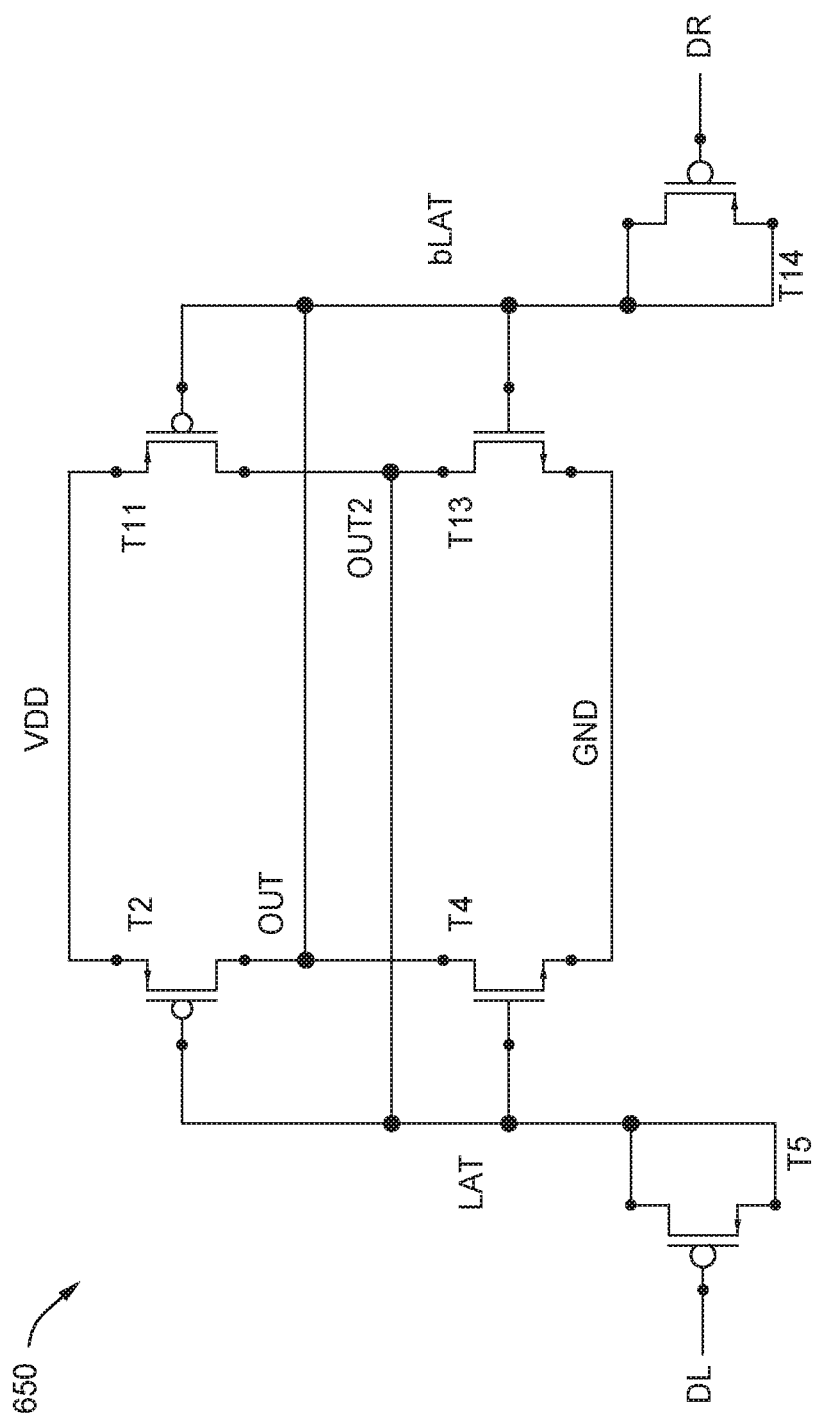

FIGS. 6A-B further illustrate a simplified representation of a second stage in an MRAM sense amplifier, according to one embodiment described herein. FIG. 6A illustrates a simplified circuit that is electrically equivalent to the offset cancellation phase of the circuit 400 illustrated in FIG. 4. As discussed above, the circuit 400 operates in phases. During the offset cancellation portion of the cycle, bEANBLE is low, bCANCEL is low, and SASET is low, as illustrated in FIG. 4. Thus, in the offset cancellation phase, the circuit 400 is electrically equivalent to the simplified circuit 600 illustrated in FIG. 6A.

As illustrated in FIG. 6A, the output (OUT) of the inverter formed by the FET devices T2 and T4 is coupled to the input (LAT) of this inverter. Both LAT and OUT are coupled to the capacitor formed using the FET device T5. Similarly, the output (OUT2) of the inverter formed by the FET devices T11 and T13 is coupled to the input (bLAT) of that inverter. Both bLAT and OUT2 are coupled to the capacitor formed using the FET device T14. Any FET mismatch between PFET device pair T2 and T11, or between NFET device pair T4 and T13, is held by the respective capacitors formed by T5 and T14. As discussed above, any suitable capacitors can be used in place of the capacitors formed using the PFET devices T5 and T14.

FIG. 6B illustrates a further simplified circuit 650 that is electrically equivalent to the circuit 400 during the signal amplification and latch phases, following the compensation phase. In these phases, bENABLE is low, bCANCEL is high, and SASET is high. Thus, in these phases the circuit 400 in FIG. 4 is electrically equivalent to the circuit 650 in FIG. 6B.

As illustrated in FIG. 6B, T2 and T4, and T11 and T13, once again act as inverters. The difference in voltage between the comparator inputs DL and DR from the first sense amp stage (e.g., 110 and 112 illustrated in FIG. 1) is coupled to LAT and bLAT. The full voltage difference between the comparator inputs is available for the cross coupled latch to amplify, because the initial stages of LAT and bLAT reflect the VT mismatches of pairs T2 and T11, and T4 and T13.

Figure 7:
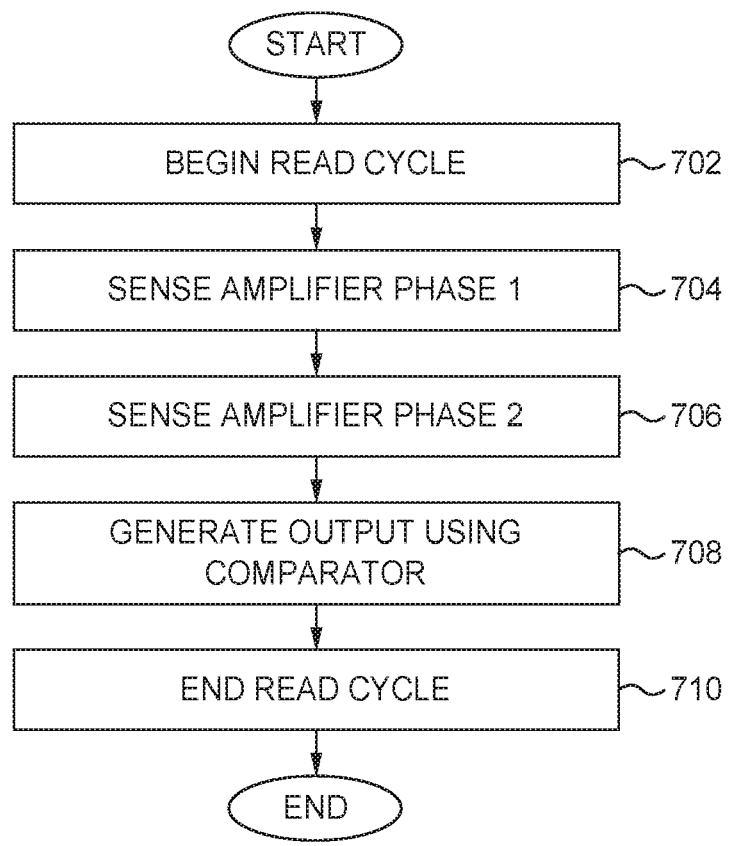
FIG. 7 is a flowchart illustrating a two stage MRAM sense amplifier, according to one embodiment described herein.

FIG. 7 is a flowchart illustrating a two stage MRAM sense amplifier, according to one embodiment described herein. For example, the flow illustrated in FIG. 7 corresponds with operation of the MRAM sense amplifiers illustrated in FIGS. 2-6. At block 702, a read cycle begins. At block 704, the sense amplifier undertakes phase 1 of the first stage. As discussed above in relation to FIG. 2, data and reference loads in the sense amplifier are switched between the left and right legs between phase 1 and 2 of the first stage, as switches coupled to the p- channel transistors open. During phase 1 of the first stage, the switches are closed and a multiplexer swaps the data and reference loads across legs of the sense amplifier (e.g., from a left leg to a right leg, and vice-versa).

At block 706, the sense amplifier undertakes phase 2 of the first stage. In this phase, the switches coupled to the p-channel transistors are open and the multiplexer no longer swaps the data and reference loads between legs. This compensates for FET mismatch between the pairs of n-channel and p-channel transistors. At block 708, a comparator generates the digital output by comparing input voltages. For example, as illustrated in FIG. 1 a comparator can compare the output voltages of the p-channel transistors on each leg of the sense amplifier, and can correspondingly output a "0" or "1" depending on the voltage difference. This represents the data stored in the memory cell. This is discussed further with regard to FIG. 8, below. At block 710, the read cycle ends.

Figure 8:
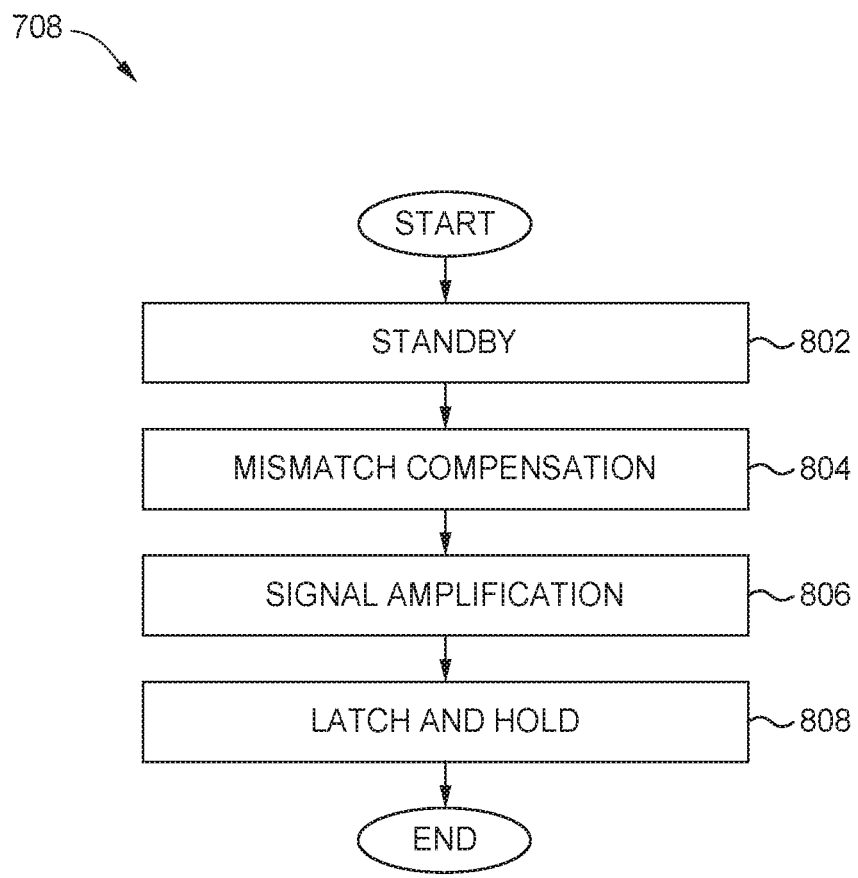
FIG. 8 is a flowchart illustrating a second stage in an MRAM sense amplifier, according to one embodiment described herein.

FIG. 8 is a flowchart illustrating a second stage in an MRAM sense amplifier, according to one embodiment described herein. In an embodiment, FIG. 8 corresponds with block 708 discussed in relation to FIG. 7, above. As discussed above, in an embodiment a second stage in an MRAM sense amplifier (e.g., a circuit 400 as illustrated in FIG. 4) has four phases of operation: standby, mismatch compensation, signal amplification, and latch and hold.

At block 802, the second stage circuit is in the standby phase. This is the phase before the read cycle starts, or at the beginning of the read cycle. In an embodiment, the circuit does not consume power (e.g., does not actively consume power or consumes minimal power) during the standby phase. As discussed above with regard to FIG. 5, in an embodiment the read cycle begins with the bENABLE signal going low.

At block 804, the second stage circuit enters the mismatch compensation phase. As discussed above, this is the phase that facilitates compensation for FET mismatch in the second stage circuit. In an embodiment, during this phase any voltage difference between device pairs (e.g., a FET mismatch between T4 and T13 or T2 and T11, as illustrated in FIGS. 4 and 6A-B) is stored in a suitable capacitor (e.g., the capacitors formed by the FET devices T5 and T14 illustrated in FIGS. 4 and 6A-B). This stored voltage difference is used to compensate for FET mismatch.

At block 806, the second stage circuit enters the signal amplification phase. During this phase, the circuit amplifies the voltage difference between the inputs (e.g., DL and DR as illustrated in FIGS. 4 and 6A-B) to generate the digital signal value for the MRAM data cell read. As discussed above, the circuit compensates for FET mismatch using the voltage difference stored in the capacitors (e.g., the capacitors formed by the FET devices T5 and T14 illustrated in FIGS. 4 and 6A-B).

At block 808, the second stage circuit enters the latch and hold phase. During this phase the circuit latches and holds the signal value. In an embodiment, the circuit holds the value until the next read phase begins.

FIG. 9 illustrates an example computer 900, according to one embodiment described herein. Various methods, procedures, modules, flow diagrams, tools, applications, circuits, elements, and techniques discussed herein may also incorporate and/or utilize the capabilities of the computer 900. Moreover, capabilities of the computer 900 may be utilized to implement features of exemplary embodiments discussed herein. One or more of the capabilities of the computer 900 may be utilized to implement, incorporate, to connect to, and/or to support any element discussed herein (as understood by one skilled in the art) in FIGS. 1-8.

Generally, in terms of hardware architecture, the computer 900 may include one or more processors 910, computer readable storage memory 920, and one or more input and/or output (I/O) devices 970 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 910 is a hardware device for executing software that can be stored in the memory 920. The processor 910 can be virtually any custom made or commercially available processor, a central processing unit (CPU), a data signal processor (DSP), or an auxiliary processor among several processors associated with the computer 900, and the processor 910 may be a semiconductor based microprocessor (in the form of a microchip) or a microprocessor. Note that the memory 920 can have a distributed architecture, where various components are situated remote from one another, but can be accessed by the processor 910. In an embodiment, the memory 920 can be formed using MRAM and using MRAM sense amplifiers as discussed in one or more embodiments herein.

The software in the computer readable memory 920 may include one or more separate programs, each of which includes an ordered listing of executable instructions for implementing logical functions. The software in the memory 920 includes a suitable operating system (O/S) 950 and one or more applications 960 of the exemplary embodiments. As illustrated, the application 960 includes numerous functional components for implementing the features, processes, methods, functions, and operations of the exemplary embodiments. The application 960 of the computer 900 may represent numerous applications, agents, software components, modules, interfaces, controllers, etc., as discussed herein but the application 960 is not meant to be a limitation.

The operating system 950 may control the execution of other computer programs, and provides scheduling, input-output control, file and data management, memory management, and communication control and related services.

The I/O devices 970 may include input devices (or peripherals) such as, for example but not limited to, a mouse, keyboard, scanner, microphone, camera, etc. Furthermore, the I/O devices 970 may also include output devices (or peripherals), for example but not limited to, a printer, display, etc. Finally, the I/O devices 970 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 970 also include components for communicating over various networks, such as the Internet or an intranet. The I/O devices 970 may be connected to and/or communicate with the processor 910 utilizing Bluetooth connections and cables (via, e.g., Universal Serial Bus (USB) ports, serial ports, parallel ports, FireWire, HDMI (High-Definition Multimedia Interface), PCIe, InfiniBand®, or proprietary interfaces, etc.).

When the computer 900 is in operation, the processor 910 is configured to execute software stored within the memory 920, to communicate data to and from the memory 920, and to generally control operations of the computer 900 pursuant to the software. The application 960 and the O/S 950 are read, in whole or in part, by the processor 910, perhaps buffered within the processor 910, and then executed.

It is understood that the computer 900 includes non-limiting examples of software and hardware components that may be included in various devices, servers, and systems discussed herein, and it is understood that additional software and hardware components may be included in the various devices and systems discussed in exemplary embodiments.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements described above, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A sense amplifier circuit for sensing a data state of a data cell during a read cycle, comprising:
   a first stage, comprising first circuitry configured to output a reference voltage and a data voltage relating to the data state of the data cell; and
   a second stage, comprising second circuitry configured to amplify a difference between the reference voltage and the data voltage, the second circuitry comprising:
      a plurality of inverters; and
      a plurality of capacitors, wherein
         the read cycle comprises a compensation phase and wherein during the compensation phase the second circuitry is configured to store, at the capacitors, a voltage difference caused by a device mismatch of the inverters, and
         wherein after the compensation phase the second circuitry is configured to amplify the difference between the reference voltage and the data voltage, and to compensate for the device mismatch using the stored voltage difference at the capacitors.

2. The sense amplifier circuit of claim 1, wherein the second circuitry is further configured to latch and hold the amplified difference until a next read cycle.

3. The sense amplifier circuit of claim 1, wherein the device mismatch is caused by a Field Effect Transistor (FET) mismatch between a pair of FETs in the inverters.

4. The sense amplifier circuit of claim 1, wherein the plurality of inverters comprises a first inverter and a second inverter, and wherein the plurality of capacitors comprises a first capacitor and a second capacitor, wherein
during the compensation phase the second circuitry is configured to store a first voltage, relating to a first threshold voltage (VT) for a first FET device in the first inverter, at the first capacitor, and is configured to store a second voltage, relating to a second VT for a second FET device in the second inverter, at the second capacitor, and
wherein the second circuitry is configured to use both the first voltage stored at the first capacitor and the second voltage stored at the second capacitor to compensate for the device mismatch.

5. The sense amplifier circuit of claim 1, wherein during the compensation phase an input of a first inverter, of the plurality of inverters, is coupled to an output of the first inverter and both the input and output of the first inverter are coupled to a first capacitor, of the plurality of capacitors.

6. The sense amplifier circuit of claim 5, wherein following the compensation phase the input of the first inverter is not coupled to the output of the first inverter, and wherein at least one of the reference voltage or the data voltage is coupled to a gate of the first inverter.

7. The sense amplifier circuit of claim 5, wherein the first inverter comprises an n-channel FET and a p-channel FET, and wherein during the compensation phase an output of the n-channel FET is coupled to a gate of the n-channel FET and an output of the p-channel FET is coupled to a gate of the p-channel FET.

8. The sense amplifier circuit of claim 7, wherein following the compensation phase the output of the n-channel FET is not coupled to the gate of the n-channel FET and the output of the p-channel FET is not coupled to the gate of the p-channel FET.

9. The sense amplifier circuit of claim 1, wherein the first stage comprises:
a first leg comprising a first transistor and a second leg comprising a second transistor,
wherein the first stage is configured to perform a two-phase read comprising:
a first phase in which the first transistor is coupled to a reference resistance circuitry and the second transistor is coupled to a data resistance circuitry, and
a second phase in which the first transistor is coupled to the data resistance circuitry and the second transistor is coupled to the reference resistance circuitry.

10. The sense amplifier circuit of claim 1, wherein the sense amplifier circuit further operates using a standby phase, and wherein during the standby phase the second stage does not consume power.

11. A magnetoresistive random access memory (MRAM) system, comprising:
a plurality of MRAM data cells; and
a sense amplifier circuit for sensing a data state of a data cell of the plurality of MRAM data cells during a read cycle, the sense amplifier circuit comprising:
a first stage, comprising first circuitry configured to output a reference voltage and a data voltage relating to the data state of the data cell; and
a second stage, comprising second circuitry configured to amplify a difference between the reference voltage and the data voltage, the second circuitry comprising:
a plurality of inverters; and
a plurality of capacitors, wherein
the read cycle comprises a compensation phase and wherein during the compensation phase the second circuitry is configured to store, at the capacitors, a voltage difference caused by a device mismatch of the inverters, and
wherein after the compensation phase the second circuitry is configured to amplify the difference between the reference voltage and the data voltage, and to compensate for the device mismatch using the stored voltage difference at the capacitors.

12. The MRAM system of claim 11, wherein the second circuitry is further configured to latch and hold the amplified difference until a next read cycle and wherein the device mismatch is caused by a Field Effect Transistor (FET) mismatch between a pair of FETs in the inverters.

13. The MRAM system of claim 11,
wherein during the compensation phase an input of a first inverter, of the plurality of inverters, is coupled to an output of the first inverter and both the input and output of the first inverter are coupled to a first capacitor, of the plurality of capacitors, and
wherein the first inverter comprises an n-channel FET and a p-channel FET, and wherein during the compensation phase an output of the n-channel FET is coupled to a gate of the n-channel FET and an output of the p-channel FET is coupled to a gate of the p-channel FET.

14. The MRAM system of claim 13, wherein following the compensation phase the output of the n-channel FET is not coupled to the gate of the n-channel FET and the output of the p-channel FET is not coupled to the gate of the p-channel FET.

15. A method of reading data from a magnetoresistive random access memory (MRAM) system, comprising:
generating a reference voltage and a data voltage relating to a data state of a data cell in the MRAM system by performing a read of the data cell during a read cycle, using a first stage of a sense amplifier circuit;
amplifying a difference between the reference voltage and the data voltage, during the read cycle, using a second stage of the sense amplifier circuit, the second stage comprising:
a plurality of inverters; and
a plurality of capacitors;
wherein the read cycle comprises a compensation phase and wherein during the compensation phase the second stage is configured to store, at the capacitors, a voltage difference caused by a device mismatch of the inverters, and
wherein after the compensation phase the second stage is configured to amplify the difference between the reference voltage and the data voltage, and to compensate for the device mismatch using the stored voltage difference at the capacitors.

16. The method of claim 15, wherein the second stage is further configured to latch and hold the amplified difference until a next read cycle.

17. The method of claim 15, wherein the device mismatch is caused by a Field Effect Transistor (FET) mismatch between a pair of FETs in the inverters.

18. The method of claim 15, wherein during the compensation phase an input of a first inverter, of the plurality of inverters, is coupled to an output of the first inverter and both the input and output of the first inverter are coupled to a first capacitor, of the plurality of capacitors.

19. The method of claim 18, wherein the first inverter comprises an n-channel FET and a p-channel FET, and wherein during the compensation phase an output of the n-channel FET is coupled to a gate of the n-channel FET and an output of the p-channel FET is coupled to a gate of the p-channel FET.

20. The method of claim 19, wherein following the compensation phase the output of the n-channel FET is not coupled to the gate of the n-channel FET and the output of the p-channel FET is not coupled to the gate of the p-channel FET.

* * * * *